United States Patent
Deligianni et al.

(10) Patent No.: US 9,653,532 B2
(45) Date of Patent: *May 16, 2017

(54) HIGH RESISTIVITY SOFT MAGNETIC MATERIAL FOR MINIATURIZED POWER CONVERTER

(71) Applicant: International Business Machines Corporation, Armonk, NY (US)

(72) Inventors: Hariklia Deligianni, Alpine, NJ (US); William J. Gallagher, Ardsley, NY (US); Andrew J. Kellock, Sunnyvale, CA (US); Eugene J. O'Sullivan, Nyack, NY (US); Lubomyr T. Romankiw, Briancliff Manor, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/224,514

(22) Filed: Jul. 30, 2016

(65) Prior Publication Data

US 2016/0336387 A1    Nov. 17, 2016

Related U.S. Application Data

(63) Continuation of application No. 14/744,127, filed on Jun. 19, 2015, now Pat. No. 9,437,668, which is a
(Continued)

(51) Int. Cl.
*H01F 5/00* (2006.01)
*H01L 49/02* (2006.01)
(Continued)

(52) U.S. Cl.
CPC .............. *H01L 28/10* (2013.01); *H01F 1/04* (2013.01); *H01F 5/00* (2013.01); *H01F 27/00* (2013.01);
(Continued)

(58) Field of Classification Search
CPC ....................... H01F 5/00; H01F 27/00–27/30
(Continued)

(56) References Cited

U.S. PATENT DOCUMENTS

| | | | | |
|---|---|---|---|---|
| 7,622,205 B2* | 11/2009 | Uwazumi | ............ | G11B 5/7315 360/135 |
| 8,039,045 B2* | 10/2011 | Tei | .......................... | C03C 15/00 427/129 |

OTHER PUBLICATIONS

Hariklia Deligianni, et al.; "High Resistivity Soft Magnetic Material for Miniaturized Power Converter"; U.S. Appl. No. 14/666,624, filed Mar. 24, 2015.
(Continued)

*Primary Examiner* — Tuyen Nguyen
(74) *Attorney, Agent, or Firm* — Cantor Colburn LLP; Vazken Alexanian

(57) ABSTRACT

An on-chip magnetic structure structure includes a magnetic material comprising cobalt in a range from about 80 to about 90 atomic % (at. %) based on the total number of atoms of the magnetic material, tungsten in a range from about 4 to about 9 at. % based on the total number of atoms of the magnetic material, phosphorous in a range from about 7 to about 15 at. % based on the total number of atoms of the magnetic material, and palladium substantially dispersed throughout the magnetic material.

8 Claims, 3 Drawing Sheets

Related U.S. Application Data continuation of application No. 14/666,624, filed on Mar. 24, 2015.

(51) Int. Cl.
  *H01L 21/288* (2006.01)
  *H01F 27/00* (2006.01)
  *H01F 1/04* (2006.01)
  *H01F 27/24* (2006.01)
  *H01F 27/28* (2006.01)
  *H01F 41/04* (2006.01)

(52) U.S. Cl.
  CPC ............ *H01F 27/24* (2013.01); *H01F 27/28* (2013.01); *H01F 41/046* (2013.01); *H01L 21/288* (2013.01); *H01L 21/2885* (2013.01)

(58) Field of Classification Search
  USPC ............................ 336/65, 83, 200, 232, 233
  See application file for complete search history.

(56) References Cited

OTHER PUBLICATIONS

Hariklia Deligianni, et al.; "High Resistivity Soft Magnetic Material for Miniaturized Power Converter"; U.S. Appl. No. 14/744,127, filed Jun. 19, 2015.
List of IBM Patents or Patent Applications Treated as Related—Date Filed: Aug. 2, 2016; 2 page.

* cited by examiner

US 9,653,532 B2

HIGH RESISTIVITY SOFT MAGNETIC MATERIAL FOR MINIATURIZED POWER CONVERTER

DOMESTIC PRIORITY

This application is a continuation of and claims priority from U.S. patent application Ser. No. 14/744,127, filed on Jun. 19, 2015, entitled "HIGH RESISTIVITY SOFT MAGNETIC MATERIAL FOR MINIATURIZED POWER CONVERTER", which is a continuation of U.S. patent application Ser. No. 14/666,624, filed on Mar. 24, 2015, entitled "HIGH RESISTIVITY SOFT MAGNETIC MATERIAL FOR MINIATURIZED POWER CONVERTER", the entire contents of both applications which are incorporated herein by reference.

BACKGROUND

The present invention relates to magnetic materials, and more specifically, to magnetic materials for miniaturized power converters.

The technologies for power conversion devices are transitioning from on-board collections of discrete components to compactly packaged collections of power conversion components on increasingly smaller scales. However, the miniature compact packages may need to be supplemented with additional discrete inductive components.

On-chip inductive components include high energy density materials, such as magnetic materials. Ferrite-based materials and metallic alloys are examples of magnetic materials. Such materials can have thicknesses ranging from hundreds of nanometers (nm) to a few microns. However, ferrite materials are generally processed at high temperatures (e.g., higher than 800° C.), which are not compatible with complementary metal-oxide semiconductor (CMOS) chip wiring processing temperatures. NiFe, CoFe, and CoZrTa are examples of magnetic alloys.

Magnetic metals can be deposited by vacuum deposition technologies (e.g., sputtering), electrodeposition, and electroless deposition in aqueous solutions. Vacuum deposition methods can be used to deposit a large variety of magnetic materials. Electrodeposition is used for the deposition of thick metal films because of its high deposition rate, conformal coverage, and low cost. Vacuum methods, however, can suffer from low deposition rates, poor conformal coverage, and the derived magnetic films are difficult to pattern.

Compared to ferrite materials, magnetic alloys can have higher permeability and magnetic flux density, which are necessary to achieve high energy density for on-chip devices. However, the resistivity of magnetic alloys can be low (e.g., less than 50 micro-ohm($\mu\Omega$)·centimeters (cm)). Further, because many on-chip devices are operated at high frequencies (e.g., higher than 10 megahertz (MHz)), large eddy currents can be induced within magnetic core. Eddy currents are circular electric currents induced within conductors by a changing magnetic field and result high AC losses at high frequencies. One method to reduce eddy currents is to increase the resistivity of the soft magnetic material so that the eddy currents are confined within each individual magnetic layer. Also thinner magnetic layers have a larger effective magnetic resistance, which results in smaller eddy currents.

SUMMARY

According to an embodiment of the present invention, an on-chip magnetic structure includes a magnetic material including cobalt in a range from about 80 to about 90 atomic % (at. %) based on the total number of atoms of the magnetic material, tungsten in a range from about 4 to about 9 at. % based on the total number of atoms of the magnetic material, phosphorous in a range from about 7 to about 15 at. % based on the total number of atoms of the magnetic material, and palladium substantially dispersed throughout the magnetic material.

According to another embodiment, a method for forming an on-chip magnetic structure includes activating a magnetic seed layer with palladium, the magnetic seed layer being positioned over a semiconductor substrate; and electrolessly plating a magnetic alloy onto the palladium to form a Pd/CoWP layer; wherein the Pd/CoWP layer includes cobalt in a range from about 80 to about 90 at. % based on the total number of atoms of the magnetic material, tungsten in a range from about 4 to about 9 at. % based on the total number of atoms of the magnetic material, phosphorous in a range from about 7 to about 15 at. % based on the total number of atoms of the magnetic material, and palladium substantially dispersed throughout the magnetic material.

Yet, according to another embodiment, a method for forming an on-chip magnetic structure includes activating a magnetic seed layer with palladium, the magnetic seed layer being positioned over a semiconductor substrate; and electrolessly plating a magnetic alloy onto the palladium in the presence of a magnetic field bias to form a film; wherein the film comprises cobalt in a range from about 80 to about 90 at. % based on the total number of atoms of the magnetic material, tungsten in a range from about 4 to about 9 at. % based on the total number of atoms of the magnetic material, phosphorous in a range from about 7 to about 15 at. % based on the total number of atoms of the magnetic material, and palladium substantially dispersed throughout the magnetic material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
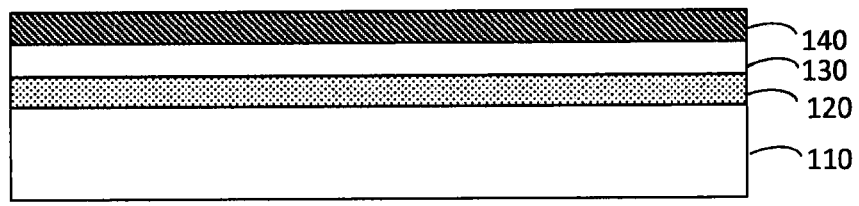
FIG. 1 is a cross-sectional view of a substrate having an adhesion layer, a seed layer, and a protective layer.

Disclosed herein are electroless plating methods and materials formed from such methods. The methods and materials are used to form on-chip magnetic structures, such as on-chip inductors or transformer structures, e.g., closed-yokes or shielded-slab structures.

In one embodiment, an on-chip magnetic structure includes a magnetic material including cobalt in a range from about 80 to about 90 at. % based on the total number of atoms of the magnetic material, tungsten in a range from about 4 to about 9 at. % based on the total number of atoms of the magnetic material, phosphorous in a range from about 7 to about 15 at. % based on the total number of atoms of the magnetic material, and palladium substantially dispersed throughout the magnetic material. The materials are referred to as Pd/CoWP materials or layers.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "atomic percent," "atomic %," and "at. %" mean the number of atoms of a pure substance divided by the total number of atoms of a compound or composition, multiplied by 100.

It is to be understood that the on-chip magnetic structures will be described in terms of a given illustrative architectures having a wafer or semiconductor substrate. However, other architectures, structures, substrate materials, process features and steps may be varied.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The design for an integrated circuit chip may be created in graphical computer programming language and stored in a computer storage medium, such as a disk, tape, physical hard drive, or virtual hard drive (e.g., a storage access network). If the designer does not fabricate the chips, or the photolithographic masks used to fabricate chips, the designer may transmit the resulting design by physical means (e.g., by providing a copy of the storage medium storing the design) or electronically (e.g., through the internet) to such entities, directly or indirectly. The stored design is then converted into the appropriate format (e.g., GDSII) for the fabrication of photolithographic masks, which can include multiple copies of the chip design in question that are to be formed on a wafer. The photolithographic masks define areas of the wafer (and/or the layers thereon) to be etched or otherwise processed.

Methods as described herein may be used to fabricate integrated circuit chips. The resulting integrated circuit chips can be distributed by the fabricator in raw wafer form (as a single wafer with multiple unpackaged chips), as a bare die, or in a packaged form. When packaged, the chip is mounted in a single chip package (e.g., a plastic carrier with leads affixed to a motherboard or other higher level carrier) or in a multichip package (e.g., a ceramic carrier that has either or both surface interconnections or buried interconnections). Following any fabrication or packaging form, the chip is then integrated with other chips, discrete circuit elements, and/or other signal processing devices as part of an intermediate product, such as a motherboard, or an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As used herein, the term "resistance" means the opposition to the passage of an electric current through a conductor. Sheet resistance measurements herein are obtained with a Magnetron Instruments M700 4-point probe immediately after deposition, as well as after annealing. An average resistivity is calculated from the sheet resistivity utilizing the total film thicknesses involved. The seed and plated layers have different resistivities, and the layer resistivity may vary within the individual layer thicknesses. However, the average value for a representative total thickness is characteristic of the resistivity what will be relevant in electrical usage.

As used herein, the term the "coercivity," or "$H_c$," is a measure of the ability of a ferromagnetic material to withstand an external magnetic field without becoming demagnetized. Thus, the coercivity is the intensity of the applied magnetic field necessary to reduce the magnetization of that material to zero after the magnetization has been driven to saturation. Coercivity is reported in units of oersted (Oe) or ampere/meter. Ferromagnetic materials with high coercivity are called magnetically "hard" materials. Materials with low coercivity are magnetically "soft" materials. Coercivity is determined by measuring the material's magnetic hysteresis loop, also called the magnetization curve. Magnetic hysteresis loop measurements herein are performed using a Vibrating Sample Magnetometer (VSM), MicroSense Model 10, on about 1 inch square samples. The applied magnetic field is varied from −100 Oe to +100 Oe. The applied field where the data line crosses zero is the coercivity.

As used herein, the term "magnetic anisotropy" means the directional dependence of a material's magnetic properties. Depending on the orientation of the magnetic field with respect to the material's crystalline lattice, a lower or higher magnetic field is necessary to reach the saturation magnetization. The "easy axis" is the direction inside a crystal, along which a small applied magnetic field is sufficient to reach the saturation magnetization. The "hard axis" is the direction inside a crystal, along which a large applied magnetic field is needed to reach the saturation magnetization.

Referring now to the drawings in which like numerals represent the same or similar elements and initially to FIGS. 1-6, an electroless plating process for forming an on-chip magnetic component is illustratively shown. The magnetic components can be inductors, transformers, magnetic yokes, magnets, and the like.

Referring to FIG. 1, an optional adhesion layer 120 is deposited onto a substrate 110, which can be any semiconductor substrate. The adhesion layer 120 is used to improve the adhesion between a seed layer 130 and the substrate 110. The adhesion layer 120 may include chromium, manganese, tungsten, molybdenum, ruthenium, palladium, platinum, iridium, rhenium, rhodium, osmium, titanium, tantalum, tungsten nitride, molybdenum nitride, titanium nitride, tantalum nitride, ruthenium nitride, iridium nitride, rhenium nitride, rhodium nitride, osmium nitride, manganese nitride, or any combination thereof. Although, other materials may be employed in the adhesion layer 120. Seed layer 130 is deposited either onto substrate 110 or the adhesion layer 120. The substrate 110 may be part of a wafer or may be a stand-alone substrate. The substrate 110 may include silicon or other substrate material, e.g., GaAs, InP, SiC, or any combination thereof.

The seed layer 130 may be formed using a physical-vapor-deposition (PVD) process (e.g., sputtering) or an electroless/electrolytic deposition process. A bias magnetic field can be applied during seed layer 130 deposition to produce magnetic anisotropy. The seed layer 130 includes a metal, for example a metal or combination of metals with magnetic properties or a non-magnetic layer. The seed layer 120 can include nickel, cobalt, iron, manganese, boron, phosphorous, platinum, palladium, ruthenium, iridium, rhodium, rhenium, tungsten, molybdenum, titanium, tantalum, copper, gold, or any combination thereof. In one embodiment, the seed layer 130 includes nickel in an amount in a range from about 60 to about 95 at. % and iron in an amount in a range from about 5 to about 40 at. %. For example, the seed layer 130 can include about 80 wt. % nickel and about 20 wt% iron ($Ni_{80}Fe_{20}$). The seed layer 130 can have a thickness of at least about 60 nm. Because the palladium activation (described below in FIG. 5) etches about 10-20 nm of the seed layer 130, the seed layer 130 cannot be too thin. When the seed layer is too thin, the electrolessly plated films deposited thereon are more susceptible to degradation of coercive force even at low temperature. Thus, without being bound by theory, it is believed that adhesion and strain of films deposited on very thin seed layers is inadequate to create a stable amorphous microstructure, resulting in degradation of magnetic properties at low temperatures. In one embodiment, the seed layer 130 is from about 50 to about 70 nm thick. In another embodiment, the seed layer 130 is from about 45 to about 95 nm thick. Yet, in another embodiment, the seed layer 130 is from about 10 to about 200 nm thick, or at least about 40 nm thick.

A top layer or protective layer 140, which is optional, may be employed to protect the seed layer 130. The top layer 140 may include, for example, titanium, although any metal or non-metal may be employed. The passive top layer 140 may be removed just before electroless plating to ensure a pristine seed layer 130 surface.

Figure 2:
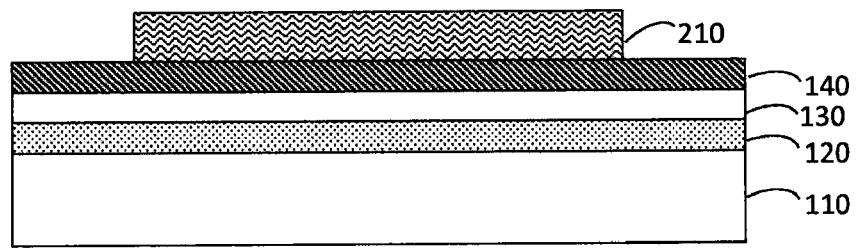
FIG. 2 is a cross-sectional view of the substrate of FIG. 1 having a lithographic resist mask patterned on the seed layer.

Referring to FIG. 2, a resist 210, such as a photoresist, is applied to a surface of the seed layer 130 or to the top layer 140, if employed. The resist 210 is patterned to achieve the desired shape of the seed layer 130, as will be described.

Figure 3:
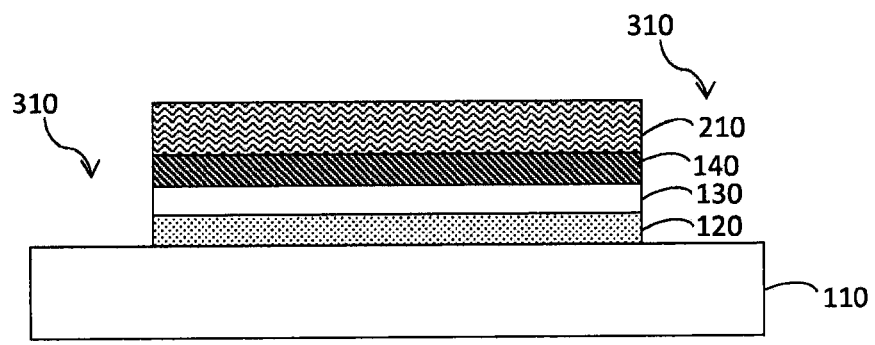
FIG. 3 is a cross-sectional view of the substrate of FIG. 2 having the protective layer, the seed layer, and the adhesion layer patterned.

Referring to FIG. 3, lithographic patterning of the seed layer 130 is performed. Lithographic patterning includes transferring the pattern of the patterned resist 210 into the adhesion and top layers 120, 140, if employed. In any case, the seed layer 130 is patterned using the resist 210. A wet etch may be employed to remove the seed layer 130, and optionally the adhesion layer 120, from field region 310. The resist 210 and the untreated top layer 140 may be removed to expose the pristine seed layer 130 in the appropriate shape onto which electrolessly deposited structures may be formed. Other methods may also be employed to pattern or expose an appropriate seed layer 130 portion.

Figure 4:
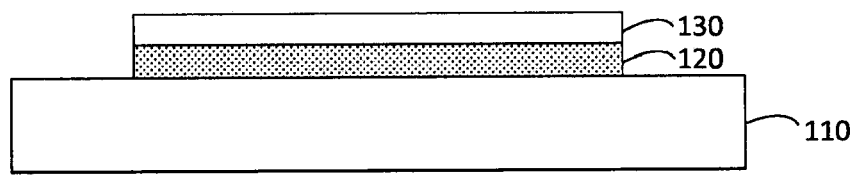
FIG. 4 is a cross-sectional view of the substrate of FIG. 3 having the resist layer and the protective layer removed.

Referring to FIG. 4, the resist 210 (mask) is removed and the top layer 140 is removed, if present. Palladium activation is performed on the seed layer 130. Palladium activation includes immersing the substrate 110 in a palladium-containing solution. For example, a palladium sulfate solution can be used. Other palladium-containing solutions and palladium salts and compounds can be used. Non-limiting examples of suitable palladium salts include palladium chloride, palladium bromide, palladium iodide, palladium acetate, palladium nitrate, or any combination thereof. The amount of palladium in an activating solution is in an amount in a range from about 50 to about 60 parts per million (ppm). In another aspect, the amount of palladium in an activating solution is from about 10 to about 100 ppm. In an exemplary embodiment, palladium sulfate is added to the seed layer in the presence of an acid. Examples of suitable acids include sulfuric acid, hydrochloric acid, nitric acid, or any combination thereof. The emersion time and temperature for palladium activation can generally vary.

Figure 5:
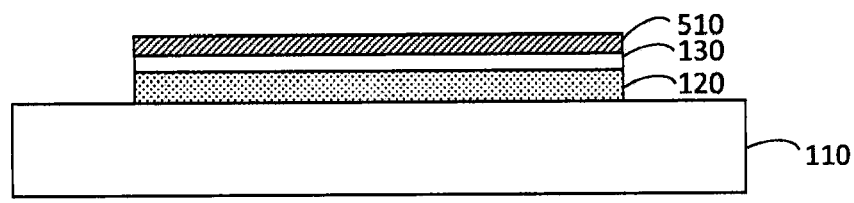
FIG. 5 is a cross-sectional view of the substrate of FIG. 4 having the seed layer palladium activated.

Referring to FIG. 5, the palladium-containing solution dissolves a portion of the seed layer 130 and creates a thin layer of palladium nanoparticles as an activated layer 510 on the seed layer 130 (activated seed layer).

Figure 6:
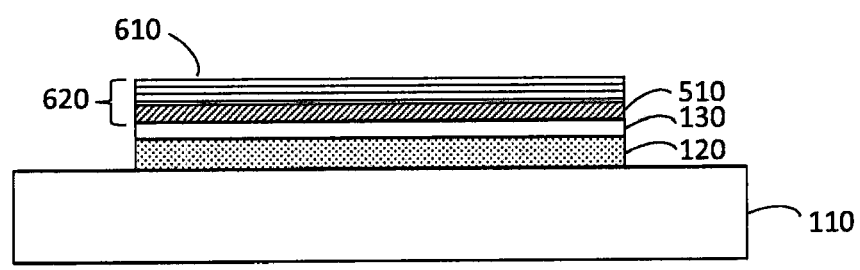
FIG. 6 is a cross-sectional view of the substrate of FIG. 5 having an electrolessly plated layer formed on the palladium activated layer.

Referring to FIG. 6, an electrolessly plated layer 610 is formed on the activated layer 510 of the seed layer 130. The electrolessly plated layer 610 is a magnetic alloy including cobalt, tungsten, and phosphorous, and the resulting Pd/CoWP material 620 includes palladium substantially dispersed throughout the electrolessly plated layer 610. Electrolessly plated layer 610 can be selectively electrolessly plated on the patterned seed layer 130 to form on-chip magnetic structures, such as yokes, coils, or other structures. The Pd/CoWP material 620 is amorphous or substantially amorphous. In another aspect, the Pd/CoWP material 620 is a soft or substantially soft material and has an $H_c$ of less than 1.0 Oe. In other embodiments, the Pd/CoWP material 620 has an Hc of less than 5 Oe.

In another embodiment, the Pd/CoWP material 620 is free of granular structures (e.g., grains), or is substantially free of granular structures. Still yet, in other embodiments, the Pd/CoWP material 620 is free of crystalline structures (e.g., crystals or nanocrystals), or is substantially free of crystalline structures.

The substrate 110 is immersed in an electroless bath to form electrolessly plated layer 610 and the resulting Pd/CoWP material 620. The Pd/CoWP material 620 can be a film. The Pd/CoWP material 620 includes a cobalt in a range from about 80 to about 90 at. %, tungsten in a range from about 4 to about 9 at. %, and phosphorous in a range from about 7 to about 15 at. %. In one aspect, cobalt is present in the Pd/CoWP material 620 in an amount in a range from about 81 to about 86 at. %. In another aspect, tungsten is present in the Pd/CoWP material 620 in an amount in a range from about 4 to about 7 at. %. In another aspect, phosphorous is present in the Pd/CoWP material 620 in an amount in a range from about 9 to about 14 at. %, or from about 9 to about 11 at. %. Cobalt can be present in an amount about or in any range from about 80, 81, 82, 83, 84, 85, 86, 87, 88, 89, to 90 at. %. Tungsten can be present in an amount about or in any range from about 4, 5, 6, 7, 8, to 9 at. %. Phosphorous can be present an amount about or in any range from about 7, 8, 9, 10, 11, 12, 13, 14, to 15 at. %.

The thickness of the Pd/CoWP material 620 can generally vary. In one aspect, the thickness of the Pd/CoWP material 620 in a range from about 1 to about 2 microns. In another aspect, the thickness of the Pd/CoWP material 620 is in a range from about 100 nm to about 2.5 microns. Yet, in another aspect, the thickness of the Pd/CoWP material 620 is in a range from about 200 nm to about 1.2 microns.

Electroless plating is performed in the presence of a field bias. The apparatus can include a permanent magnet for applying a field bias, which can generally vary. In one embodiment, the field bias is from about 0.9 to about 1.1 Tesla during plating. The electroless solution is placed between the magnetic poles. The electroless solution can be heated to a constant temperature. The substrate 110 to be electrolessly plated is then placed inside the electroless solution. The surface of the substrate 110 is then coated with a seed layer 130, and optionally an adhesive layer 120 and top layer 140. The seed layer 130 is deposited in the presence of an applied magnetic field to produce thin films with magnetic anisotropy. The deposition time and temperature can generally vary.

The above-disclosed ranges of cobalt, tungsten, and phosphorous on a palladium-activated seed layer provide a Pd/CoWP magnetic material with both high resistivity and high magnetic flux. Generally, resistivity can be compromised in materials having high magnetic flux. In CoWP materials, adding phosphorous can decrease magnetic flux. Although adding tungsten increases resistivity, merely combining cobalt, tungsten, and phosphorous alone does not provide the combination of magnetic flux and resistivity desired for miniaturized on-chip power converters. Thus, surprisingly, the method described herein for electrolessly plating a layer of cobalt, tungsten, and phosphorous, in the described proportions and on a palladium activated seed layer, provides a Pd/CoWP material with the desired properties. Slow deposition of the metals, as well as using palladium to activate the seed layer as described provides a magnetic material in which palladium is substantially dispersed throughout the CoWP electrolessly plated layer 610.

In contrast to other known methods and materials, palladium generally functions as a seed layer remaining at the base of an electrolessly plated magnetic material layer. Without being bound by theory, it is believed that having palladium substantially dispersed throughout the cobalt, tungsten, and phosphorous layer contributes to the favorable properties of the magnetic material.

Following palladium activation, the palladium seed nucleation sites also pin the microstructure of the Pd/CoWP and keep it amorphous to a temperature of at least 200° C. Grains or crystal formation within the Pd/CoWP material results in films that are magnetically unstable. In one embodiment, the Pd/CoWP described herein is substantially amorphous from about room temperature to 200° C. In another embodiment, the Pd/CoWP is substantially amorphous from about 150 to about 240° C.

The electroless solution includes a source of cobalt, tungsten, and phosphorous, which can be any compound or salt thereof. The deposition time and temperature can generally vary. In an exemplary embodiment, the deposition rate is from about 1 to 10 nm per minute, and the deposition time is from about 50 to about 200 minutes. In another exemplary embodiment, the deposition temperature is from about 75 to about 120° C.

Non-limiting examples of suitable cobalt sources include cobalt salts, including cobalt sulfate, cobalt sulfate heptahydrate, cobalt nitrate, cobalt acetate, cobalt carbonate, cobalt citrate, cobalt acetylacetonate, cobalt carboxylates (e.g., cobalt acetate, cobalt formate, cobalt propanoate, cobalt butanoate, cobalt pentanoate, and cobalt hexanoate), or any combination thereof. The cobalt source may be included in a wide range of concentrations. In one embodiment, the concentration is from about 50 millimolar (mM) to 100 mM. In another embodiment, the concentration is from about 60 mM to 80 mM.

Non-limiting examples of suitable tungsten sources include tungstate salts. In one embodiment, tungsten salts include cationic groups of alkaline or alkaline earth metals. Non-limiting examples of suitable tungstate salts include sodium tungstate, potassium tungstate, magnesium tungstate, calcium tungstate, or any combination thereof. The tungsten source may be included in a wide range of concentrations. In one embodiment, the concentration is from about 200 mM to 700 mM. In another embodiment, the concentration is from about 300 mM to 500 mM.

The electroless solution includes a source of phosphorous, which can also function as a reducing agent. Non-limiting examples of a suitable phosphorous sources/reducing agents include sodium hypophosphite or sodium hypophosphite monohydrate. The sodium hypophosphite may be included in a wide range of concentrations. In one embodiment, the concentration is from about 100 mM to about 500 mM. In another embodiment, the concentration is from about 250 mM to about 450 mM.

The electroless solution can include additives, such as one or more of a buffer, a complexing agent, a stabilizer, or a surfactant. Non-limiting examples of suitable buffers include boric acid, carbonic acid, phosphoric acid, salts thereof, and mixtures thereof. Other examples of suitable buffers include piperidine salts and complexes, methylamine salts and complexes, N-cyclohexyl-3-aminopropanesulfonic acid (CAPS) salts and complexes, 4-(cyclohexylamino)-1-butanesulfonic acid (CABS) salts and complexes, or any combination thereof. The concentration of the buffer is selected to achieve a desired pH of of about 8.0 to 10.0.

Non-limiting examples of suitable complexing agents include citric acid, lactic acid, tartaric acid, succinic acid, oxalic acids, amino acids, salts thereof, and mixtures thereof. The concentration of the complexing agent can generally vary. In one embodiment, the concentration of the complexing agent is from about 250 mM to 750 mM. In an exemplary embodiment, the concentration of the complexing agent is from about 400 to about 600 mM.

Suitable surfactants include non-ionic surfactants. Non-limiting examples of suitable non-ionic surfactants include polysorbates, polyethylene glycol (PEG), 4-(1,1,3,3-tetramethylbutyl) phenol/poly(oxyethylene) polymers, poly(oxyethylene)-poly(oxypropylene) block copolymers, and the like, and mixtures thereof. In one embodiment, the surfactant is present in an amount from about 2.5 to about 7.5 ppm. In an exemplary embodiment, the surfactant is present in an amount from about 4 to about 6 ppm.

Non-limiting examples of suitable stabilizers include lead salts, such as lead acetate and lead nitrate, cadmium salts, such as cadmium acetate and cadmium nitrate, or any combination thereof. In one embodiment, the stabilizer is present in an amount in a range from about 0.01 to about 0.5 ppm. In an exemplary embodiment, the stabilizer is present in an amount from about 0.05 to about 10 ppm.

After electroless plating, annealing is performed in a vacuum furnace in the presence of a magnetic field bias. The time and temperature for annealing can generally vary. In one embodiment, the electrolessly plated substrates are annealed at a temperature from about 125 to 250° C. for a time from about 15 to 60 minutes. Additionally, electrolessly plated substrates are further annealed to 200 to 250° C. in a forming gas or nitrogen atmosphere in order to induce stress relaxation and evaluate the effects on the magnetic properties in the post-annealed state.

After a 200° C. anneal for 1 hour, Pd/CoWP films described herein maintain their magnetic properties, or are magnetically stable. For example, the difference in the hard axis $H_c$ after deposition and then after annealing to 200° C. is less than about 0.5 Oe. In some embodiments, the difference in the hard axis $H_c$ after deposition and annealing to 200° C. is less than 0.8, 0.7, 0.6, 0.5, 0.4, 0.3, 0.2, and 0.1 Oe, indicating that the magnetic properties are maintained after the anneal. In another embodiment, the hard axis $H_c$ is less 1.0 Oe. Yet in another embodiment, the Pd/CoWP is magnetically stable to at least 200° C. for at least 1 hour.

The Pd/CoWP films also maintain high resistivity after annealing. In one embodiment, the resistivity is at least 110 μΩ·cm after annealing. In another embodiment, the resistivity is at least 100 μΩ·cm after annealing. Yet, in another embodiment, the resistivity is at least 105, at least 115, at least 120, or at last 125 μΩ·cm after annealing.

EXAMPLES

Example 1

Silicon wafers were immersed in an electroless solution within a double-jacketed glass beaker between the poles of a permanent magnet. Table 1 below shows the electroless bath composition. A field bias of about 1 Tesla was applied during electroless plating. A heater was used to heat the water circulating in the external jacket of the beaker to a constant temperature. The silicon wafers were oriented with the plated surface being in line with the magnetic flux lines. The silicon wafers were coated with a nanometer thick vapor deposited seed layer of $Ni_{80}Fe_{20}$. The NiFe seed layer was deposited in the presence of an applied magnetic field.

TABLE 1

| | |
|---|---|
| Cobalt Sulfate Heptahydrate | 0.07M |
| Sodium Tungstate Dihydrate | 0.40M |
| Sodium Hypophosphite Monohydrate | 0.34M |
| Citric Acid Anhydrous | 0.50M |
| Boric Acid | 0.50M |
| Lead Acetate | 0.10 ppm |
| Polyethylene Glycol | 5.00 ppm |
| pH | 9 |
| Temperature | 90° C. |
| Palladium Sulfate - Bath Activation | 55 ppm/10% $H_2SO_4$/3.0 min |

Example 2

After electroplating in Example 1, the samples were annealed in a vacuum furnace in the presence of a 1 Tesla magnetic field applied along the easy axis. The annealing temperature was set to 200 or 250° C. for one hour. A temperature ramping rate of 5° C/minute was used, along with a cooling rate of 5° C/minute under constant nitrogen flow.

Example 3

The magnetic properties of a sample with a 140 nm Pd/CoWP layer grown on a NiFe/Ti seed without an applied magnetic field were evaluated. More than half the initial thickness of NiFe seed was etched by the palladium solution. The palladium ions exchanged (deposited) with the iron that readily dissolved. As a result, the interface of the NiFe/Pd seed was somewhat rough, which was reflected in the magnetic properties of the 140 nm thin Pd/CoWP film that was deposited without a magnetic field. High values for the as-deposited coercive force ($H_c$) (9.0 Oe) and anisotropy field ($H_k$) (~25 Oe) were observed. When the film was annealed at 150° C. in the 1 Tesla field, the $H_c$ of the hard axis improved to 7.0 Oe. With further annealing to 250° C., magnetic properties did not degrade to be any worse than the properties of the as-plated film. Thus, it was concluded that the 140nm Pd/CoWP layer was also magnetically stable to 250° C.

Example 4

Films of thicknesses varying from 150 to 1,000 nm were evaluated. The compositions and thicknesses are shown in Table 2. Samples FX01-5, 6, D3, 7, 8, D4 were processed at a lower temperature (70° C. compared to 90° C.) to assess the effect of deposition temperature. Sheet resistance and resistivity were measured for the CoWP and the Pd/CoWP samples. The resistivity of CoWP was measured to be about 73 to 95 μΩ·cm, and the corresponding resistivity of the Pd/CoWP films was measured between 105 and 149 μΩ·cm, which is within the desired resistivity range for an on-chip inductor.

TABLE 2

| Sample | [Co] at. % | [W] at. % | [P] at. % | Thickness (Å) | Pd (Å) | NiFe (Å) | Plating Time & T(° C.) | pH | Anneal T (° C.) | Initial Res., ohmcm | Final Res., ohmcm |
|---|---|---|---|---|---|---|---|---|---|---|---|
| FX01-NiFe seed | | | | | | 600 | | | | 21.2 | |
| FX01-1 | 83.5 ± 1 | 6.5 ± 1 | 10 ± 1 | 4600 ± 200 | | 600 ± 50 | 100 min, 90 C. | 9.13 | 150 C. 30 min 1 T/250 C. 1 hr | 74.5 | 73 |
| FX01-2 | 85 ± 1 | 5 ± 1 | 10 ± 1 | 9000 ± 200 | | 600 ± 50 | 200 min, 90 C. | 9.13 | 150 C. 30 min 1 T/250 C. 1 hr | 100 | 97.5 |
| FX01-D1 | 84.5 ± 1 | 5.5 ± 1 | 10 ± 1 | 9700 ± 200 | | 600 ± 50 | 230 min, 90 C. | 9.13 | 150 C. 30 min 1 T/250 C. 1 hr | 96 | 95 |
| FX01-3 | 85 ± 1 | 5 ± 1 | 10 ± 1 | 4600 ± 200 | <10 | 400 ± 50 | 100 min, 90 C. | 9.13 | 150 C. 30 min 1 T/250 C. 1 hr | 110 | 105 |
| FX01-4 | 84.5 ± 1 | 5.5 ± 1 | 10 ± 1 | 6900 ± 200 | 10 | 400 ± 50 | 200 min, 90 C. | 9.13 | 150 C. 30 min 1 T/250 C. 1 hr | 124 | 122 |
| FX01-D2 | 83.5 ± 1 | 5.5 ± 1 | 11 ± 1 | 10000 ± 200 | 10 | 400 ± 50 | 230 min, 90 C. | 9.13 | 150 C. 30 min 1 T/250 C. 1 hr | 125 | 137 |
| FX01-5 | 85.0 ± 0.5 | 5.0 ± 0.5 | 10.0 ± 0.5 | 1527 ± 100 | | 430 ± 50 | 100 min, 70 C. | 9.13 | 150 C. 30 min 1 T/250 C. 1 hr | 40 | 38.25 |
| FX01-6 | 85.5 ± 1 | 4.5 ± 1 | 10 ± 1 | 3600 ± 200 | | 400 ± 50 | 200 min, 70 C. | 9.13 | 150 C. 30 min 1 T/250 C. 1 hr | 60 | 59.4 |
| FX01-D3 | 85.5 ± 1 | 4.5 ± 1 | 10 ± 1 | 3000 ± 200 | | 500 ± 50 | 230 min, 70 C. | 9.13 | 150 C. 30 min 1 T/250 C. 1 hr | 57.3 | 56.7 |
| FX01-7 | 84.5 ± 0.5 | 5.2 ± 0.5 | 10.3 ± 0.5 | 1843 ± 100 | 25 ± 5 | 185 ± 50 | 100 min, 70 C. | 9.13 | 250 C. 15 min 1 Tesla | 127 | 126.3 |
| FX01-8 | 84.2 ± 0.5 | 4.8 ± 0.5 | 11 ± 0.5 | 3011 ± 100 | 14 ± 5 | 294 ± 50 | 200 min, 70 C. | 9.13 | 250 C. 15 min 1 Tesla | 116.1 | 115.2 |
| FX01-D4 | 85.0 ± 1 | 5.0 ± 1 | 10 ± 1 | 3500 ± 200 | 14 ± 5 | 200 ± 50 | 230 min, 70 C. | 9.13 | 250 C. 15 min 1 Tesla | 156 | 149.4 |
| FX01-9 | 83.5 ± 1 | 5.5 ± 1 | 11 ± 1 | 7500 ± 200 | 14 ± 5 | 300 ± 50 | 200 min, 90 C. | 9.13 | 250 C. 15 min 1 Tesla | 122 | 120 |
| FX01-10 | 83.0 ± 1 | 7.0 ± 1 | 10 ± 1 | 6600 ± 200 | | 500 ± 50 | 200 min, 90 C. | 9.13 | 250 C. 15 min 1 Tesla | 86 | 85.8 |
| FX01-D5 | 84.0 ± 1 | 6.0 ± 1 | 10 ± 1 | 8800 ± 200 | 14 ± 5 | 400 ± 50 | 230 min, 90 C. | 9.13 | 250 C. 15 min 1 Tesla | 114.4 | 113.8 |

Example 5

The effects of anneals to 200° C. and lead acetate as a stabilizer were evaluated. Table 3 shows the experimental parameters for depositing CoWP and Pd/CoWP films. Some samples were plated without lead acetate as a stabilizer in the. Samples were annealed either at 200° C. or at 250° C.

The resistivity of the as-deposited CoWP layer was about 92 μΩ·cm, whereas an as-deposited Pd/CoWP had a resistivity of 118 μΩ·cm. Another sample with Pd/CoWP had an as-deposited resistivity of 110 μΩ·cm. The resistivity of the more than 1 μm thick Pd/CoWP films did not change with annealing to 200° C. As determined by transmission electron microscopic (TEM) analysis, recrystallization of the amorphous material was found to be responsible for thermal instability (not shown). Thus, maintenance of the resistivity indicated that there no recrystallization of the Pd/CoWP layers occurred.

Figure 7A:
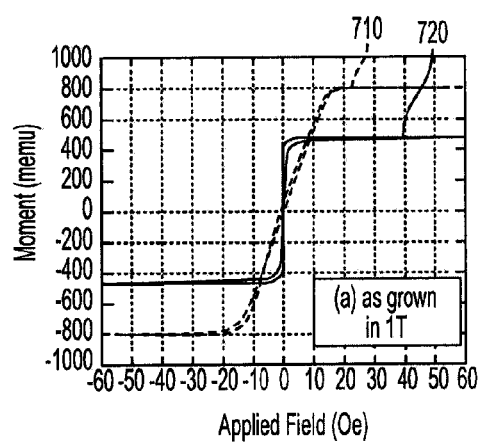
FIG. 7A is a graph showing moment as a function of applied field for an as-deposited Pd/CoWP layer.
Figure 7B:
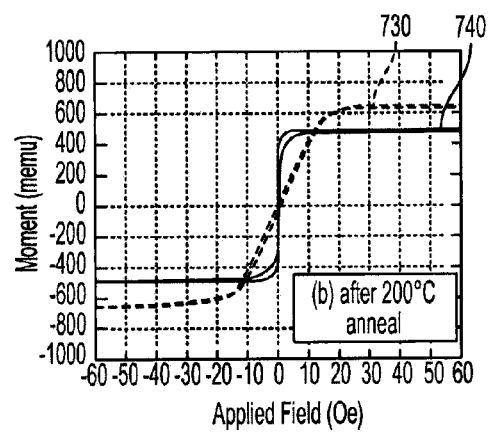
FIG. 7B is a graph showing moment as a function of applied field for a Pd/CoWP layer after annealing to 200° C. for 1 hour.

FIG. 7A shows magnetics measurements of an 800 nm Pd/CoWP layer as deposited in the presence of a 1 Tesla magnetic field (easy axis 710, hard axis 720). The hard axis $H_c$ was 0.79 Oe; and FIG. 7B shows the Pd/CoWP layer after annealing to 200° C. for 1 hour (easy axis 730, hard axis 740). The hard axis $H_c$ was 0.65 Oe. Thus, the soft magnetic properties of the as-deposited Pd/CoWP layers either improve or remain approximately constant with thermal annealing to 200° C. for 1 hour. Similar results (not shown) were obtained for 1.18 mm thick Pd/CoWP layers ($H_c$=0.77 Oe as deposited, and $H_c$=0.74 Oe after 200° C. anneal for 1 hour).

However, when the chemistry of CoWP did not contain the lead acetate as a stabilizer, even annealing to 200° C. induced large grain growth (not shown). TEM analysis revealed that the grains grew to about 300 nm. The value of the coercive force $H_c$ of 1.7 Oe, also indicated that grains were present.

Example 6

To further evaluate the effect of lead acetate on thermal stability and grain growth, TEM was performed on plated CoWP and Pd/CoWP films that were stored for more than 1 month. The films that contained lead were exceedingly more stable. The films were also amorphous. However, the films without lead exhibited substantial grain growth.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming an on-chip magnetic structure, the method comprising:

activating a magnetic seed layer with palladium to form a layer of palladium nanoparticles on a surface of the magnetic seed layer; and forming a magnetic alloy layer on the layer of palladium nanoparticles, the magnetic alloy layer comprising cobalt in a range from about 80 to about 90 at. % based on the total number of atoms of the magnetic alloy layer, tungsten in a range from about 4 to about 9 at.% based on the total number of atoms of the magnetic alloy layer, phosphorous in a range from about 7 to about 15 at.% based on the total number of atoms of the magnetic alloy layer, and palladium substantially dispersed throughout the magnetic alloy layer.

2. The method of claim 1, wherein the magnetic seed layer comprises nickel and iron.

3. The method of claim 1, wherein the on-chip magnetic structure is an inductor.

4. The method of claim 1, wherein the magnetic alloy layer is amorphous.

5. The method of claim 1, wherein the magnetic seed layer is at least 40 nm thick.

6. The method of claim 1, wherein the magnetic alloy layer is magnetically stable to at least 200° C. for at least 1 hour.

7. The method of claim 1, wherein the cobalt is in a range from about 81 to about 86 at %.

8. The method of claim 1, wherein the magnetic seed layer comprises nickel and iron.

* * * * *